(12) United States Patent
Clevenger et al.

(10) Patent No.: US 8,241,992 B2
(45) Date of Patent: Aug. 14, 2012

(54) METHOD FOR AIR GAP INTERCONNECT INTEGRATION USING PHOTO-PATTERNABLE LOW K MATERIAL

(75) Inventors: Lawrence A. Clevenger, Lagrangeville, NY (US); Maxime Darnon, White Plains, NY (US); Qinghuang Lin, Yorktown Heights, NY (US); Anthony D. Lisi, Poughkeepsie, NY (US); Satyanarayana V. Nitta, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 12/776,885

(22) Filed: May 10, 2010

(65) Prior Publication Data

US 2011/0272810 A1 Nov. 10, 2011

(51) Int. Cl.
*H01L 21/76* (2006.01)
*H01L 21/4763* (2006.01)
*H01L 21/44* (2006.01)

(52) U.S. Cl. ........ 438/421; 438/411; 438/422; 438/618; 438/619; 438/636; 438/638; 438/669; 438/670; 438/671; 438/672; 438/673; 438/674; 438/675

(58) Field of Classification Search .................. 438/421, 438/422, 411
See application file for complete search history.

(56) References Cited

U.S. PATENT DOCUMENTS

| 4,371,605 | A | 2/1983 | Renner |
| 5,886,102 | A | 3/1999 | Sinta et al. |
| 5,939,236 | A | 8/1999 | Pavelchek et al. |
| 6,025,260 | A | 2/2000 | Lien et al. |
| 6,087,064 | A | 7/2000 | Lin et al. |
| 6,214,719 | B1 | 4/2001 | Nag |
| 6,455,416 | B1 | 9/2002 | Subramanian et al. |
| 6,492,256 | B2 | 12/2002 | Lee et al. |
| 6,492,732 | B2 | 12/2002 | Lee et al. |
| 6,514,667 | B2 | 2/2003 | Angelopoulos et al. |
| 6,566,019 | B2 | 5/2003 | Kling et al. |
| 6,780,753 | B2 | 8/2004 | Latchford et al. |

(Continued)

FOREIGN PATENT DOCUMENTS

CA 1204547 5/1986

(Continued)

OTHER PUBLICATIONS

Owe-Yang, D.C., et al., "Double exposure for the contact layer of the 65-nm node", Proc. SPIE, 2005, Adv. Resist Technology and Processing, vol. 5753, pp. 171-180.

(Continued)

*Primary Examiner* — Nathan Ha
*Assistant Examiner* — Michael Jung
(74) *Attorney, Agent, or Firm* — Scully, Scott, Murphy & Presser, P.C.; Louis J. Percello, Esq.

(57) ABSTRACT

Methods for producing air gap-containing metal-insulator interconnect structures for VLSI and ULSI devices using a photo-patternable low k material as well as the air gap-containing interconnect structure that is formed are disclosed. More particularly, the methods described herein provide interconnect structures built in a photo-patternable low k material in which air gaps are defined by photolithography in the photo-patternable low k material. In the methods of the present invention, no etch step is required to form the air gaps. Since no etch step is required in forming the air gaps within the photo-patternable low k material, the methods disclosed in this invention provide highly reliable interconnect structures.

18 Claims, 4 Drawing Sheets

U.S. PATENT DOCUMENTS

| | | | |
|---|---|---|---|
| 6,787,469 B2 | 9/2004 | Houston et al. | |
| 6,805,109 B2 | 10/2004 | Cowan | |
| 6,861,180 B2 | 3/2005 | Chang | |
| 6,861,367 B2 | 3/2005 | Gilton et al. | |
| 7,041,748 B2 | 5/2006 | Lin et al. | |
| 7,056,840 B2 | 6/2006 | Miller et al. | |
| 7,064,078 B2 | 6/2006 | Liu et al. | |
| 7,071,532 B2 | 7/2006 | Geffken et al. | |
| 7,091,611 B2 | 8/2006 | Ahn et al. | |
| 7,138,329 B2 | 11/2006 | Lur et al. | |
| 7,253,095 B2 | 8/2007 | Lur et al. | |
| 7,306,853 B2 | 12/2007 | Lin et al. | |
| 8,071,459 B2 * | 12/2011 | Braeckelmann et al. | 257/522 |
| 2001/0016412 A1 | 8/2001 | Lee et al. | |
| 2002/0163082 A1 | 11/2002 | Lee et al. | |
| 2003/0073028 A1 | 4/2003 | Kim et al. | |
| 2003/0129531 A1 | 7/2003 | Oberlander et al. | |
| 2003/0198877 A1 | 10/2003 | Pfeiffer et al. | |
| 2004/0048194 A1 | 3/2004 | Breyta et al. | |
| 2004/0094821 A1 | 5/2004 | Lur et al. | |
| 2004/0151489 A1 | 8/2004 | Zhou | |
| 2005/0093158 A1 | 5/2005 | Liu et al. | |
| 2005/0263896 A1 | 12/2005 | Lur et al. | |
| 2006/0228895 A1 | 10/2006 | Chae et al. | |
| 2007/0003841 A1 | 1/2007 | Choi | |
| 2007/0020565 A1 | 1/2007 | Koh et al. | |
| 2007/0054198 A1 | 3/2007 | Park | |
| 2007/0148968 A1 | 6/2007 | Kwon et al. | |
| 2007/0212649 A1 | 9/2007 | Lalbahadoersing et al. | |
| 2007/0248899 A1 | 10/2007 | Choi | |
| 2008/0173984 A1 | 7/2008 | Lin et al. | |
| 2008/0182404 A1 * | 7/2008 | Demos et al. | 438/619 |
| 2008/0286467 A1 | 11/2008 | Allen et al. | |
| 2009/0079075 A1 | 3/2009 | Lin et al. | |
| 2009/0079076 A1 | 3/2009 | Lin et al. | |
| 2009/0081418 A1 | 3/2009 | Allen et al. | |
| 2009/0174067 A1 | 7/2009 | Lin | |
| 2009/0233226 A1 | 9/2009 | Allen et al. | |
| 2009/0291389 A1 | 11/2009 | Allen et al. | |
| 2009/0309230 A1 * | 12/2009 | Cui et al. | 257/773 |
| 2011/0266682 A1 * | 11/2011 | Edelstein et al. | 257/773 |

FOREIGN PATENT DOCUMENTS

JP          01293339          11/1989

OTHER PUBLICATIONS

U.S. Appl. No. 12/721,032 entitled, "Methods for Fabrication of an Air Gap-Containing Interconnect Structure", filed on Mar. 10, 2010, first named inventor: Lawrence A. Clevenger.

U.S. Appl. No. 12/569,200 entitled, "Patternable Low-k Dielectric Interconnect Structure With a Graded Cap Layer and Method of Fabrication ", filed Sep. 29, 2009, first named inventor: Qinghuang Lin.

* cited by examiner

METHOD FOR AIR GAP INTERCONNECT INTEGRATION USING PHOTO-PATTERNABLE LOW K MATERIAL

RELATED APPLICATIONS

This application is related to co-pending and co-assigned U.S. application Ser. No. 12/721,032, entitled "METHODS FOR FABRICATION OF AN AIR GAP-CONTAINING INTERCONNECT STRUCTURE" filed Mar. 10, 2010, and co-pending and co-assigned U.S. application Ser. No. 12/768,267, entitled "STRUCTURES AND METHODS FOR AIR GAP INTEGRATION" filed Apr. 27, 2010, the entire contents of which are both incorporated herein by reference.

FIELD OF THE INVENTION

The present invention relates to air gap-containing metal-insulator interconnect structures for Very Large Scale Integrated (VLSI) and Ultra-Large Scale Integrated (ULSI) devices and methods of forming the same.

BACKGROUND OF THE INVENTION

Interconnect structures in integrated circuits induce a delay in the propagation of the information between semiconductor devices such as transistors. To reduce this delay, the interconnect structures should posses the lowest capacitance possible. One approach to form interconnect structures with the lowest possible capacitance is to introduce air (or vacuum) gaps into the interconnect dielectric part of the interconnect structure; by replacing a portion of the dielectric material with an air gap, the capacitance can be reduced dramatically.

Among several integration schemes proposed for air gap integration, a dielectric etch back scheme is the most commonly used. See, for example, Arnal et al. 2001 Proc. IEEE International Interconnect Technology Conference, pages 398-400. In this scheme, the gap is etched in a dielectric cap between two metal lines, and eventually transferred into the dielectric material. After transferring the gap into the dielectric material, the dielectric material is isotropically removed between the two metal lines. A dielectric deposition process is then performed that pinches off the gap such that the next interconnect level can be fabricated.

There are several problems with the aforementioned prior art air gap fabrication scheme. First, the above mentioned prior art air gap fabrication scheme requires a very accurate lithographic step to define trenches between the metal lines. Furthermore, the above mentioned prior art scheme requires an etch step to remove the dielectric in between the metal lines. If the lithography step is not perfect (misalignment, or too large an opening may result) and, if the etch step leads to a width increase, the metal lines can be damaged by this etch step. The isotropic etch process may also damage the sidewalls of the metal line or the interface between the metal lines and an overlying cap layer. Both issues may lead to reliability issues.

Finally, the need for very high resolution lithography and a critical etch step leads to a huge increase in the cost of the air gap module. Thus, there is a need for a simplified integration scheme that leads to cheap and reliable air gap-containing interconnect structures.

SUMMARY

The present invention relates to methods for producing air gap-containing metal-insulator interconnect structures for VLSI and ULSI devices using a photo-patternable low k (PPLK) material as well as the air gap-containing interconnect structure formed thereby. More particularly, the methods described herein provide interconnect structures built in a photo-patternable low k material in which air gaps are defined by photolithography in the photo-patternable low k material. In the methods of the present invention, no etch step is required to form the air gaps. Since no etch step is required in forming the air gaps within the photo-patternable low k material, the methods disclosed in this invention provide highly reliable interconnect structures.

In one aspect of the present disclosure, an air gap-containing interconnect structure is provided in which a patterned and cured PPLK material includes a plurality of electrically conductive filled regions and air gaps that are located between neighboring (vertically and/or horizontally) electrically conductive filled regions. Specifically, the air gap-containing interconnect structure includes a substrate, a material stack located on an upper surface of the substrate, a patterned first low k material located on an uppermost surface of the material stack, a patterned second low k material located on an upper surface of the patterned first low k material, a patterned and cured photo-patternable low k (PPLK) material located on an upper surface of the patterned second low k material, and a dielectric cap located on an upper surface of the patterned and cured PPLK material. The patterned and cured PPLK material has a plurality of electrically conductive filled regions and air gaps located therein. At least a lower portion of one of the plurality of electrically conductive filled regions extends through the patterned first and second low k materials. Moreover, one of the air gaps of the structure disclosed herein includes an extended width lower portion that is present in the first patterned low k material and is connected with the one of the air gaps in the patterned and cured PPLK material by an opening within the patterned second low k material.

In one embodiment of the present invention, the plurality of electrically conductive filled regions as well as the air gaps within the patterned and cured PPLK material have a sub-lithographic width, i.e., a width of 10 nm to 40 nm.

In another aspect of the invention, a method of forming an air gap-containing interconnect structure is provided. The method includes providing a patterned mask on a surface of an initial structure, the initial structure including a substrate, a material stack located on an upper surface of the substrate, a first low k material located on an uppermost surface of the material stack, and a second low k material located on an upper surface of the first low k material, wherein the patterned mask has at least one first opening that exposes a portion of the second low k material. The exposed portion of the second low k material is then etched utilizing the patterned mask as an etch mask to form a patterned second low k material having the one first opening therein. A patterned photoresist is formed on an upper surface of the patterned second low k material, wherein a portion of the patterned photoresist fills the at least one first opening within the patterned second low k material. The patterned photoresist has at least one second opening that exposes a portion of the patterned second low k material. The exposed portion of the patterned second low k material as well as underlying portion of the first low k material are then etched utilizing the patterned photoresist as an etch mask to form a patterned second low k material having the one first opening and an upper portion of the at least one second opening therein and a patterned first low k material having a lower portion of the at least one second opening therein. A patterned and cured photo-patternable low k (PPLK) material having a plurality of electrically conductive filled regions and gaps located therein is formed atop the patterned second low k material, wherein at least one of the plurality of electrically conductive filled regions is located within the at least one second opening and wherein one of the gaps is located above and connected with the at least one first opening located within the patterned second low k material. A lateral etching process is then performed that forms an expanded width gap within the patterned first low k material which is located beneath and connected with the at least one first opening formed in the patterned second low k dielectric material. A dielectric cap is formed atop the patterned and cured PPLK material forming air gaps at least within the PPLK material.

In one embodiment, the patterned mask is a patterned photoresist formed by lithography, while in another embodiment, the patterned mask is a self-assembled co-polymer mask formed utilizing a self-assembling block copolymer, annealing the self-assembling block copolymer into a self-assembled block copolymer and removing at least one of the polymeric components of the self-assembled block copolymer. The self-assembled co-polymer mask has sub-lithographic features.

BRIEF DESCRIPTION OF SEVRAL VIEWS OF THE DRAWINGS

Figure 4:
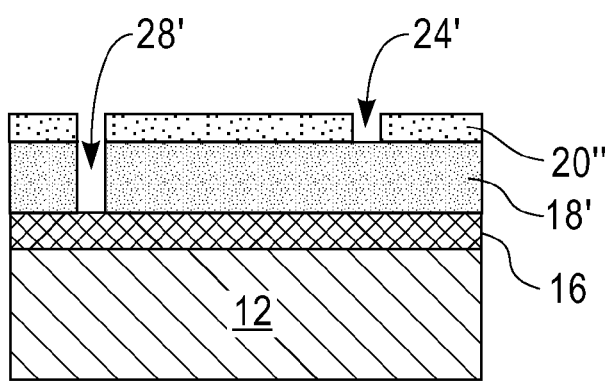
FIG. 4 is a pictorial representation (through a cross sectional view) depicting the structure of FIG. 3 after transferring the at least one second opening into the patterned second low k material and the underlying first low k material and removal of the second patterned photoresist.
Figure 5:
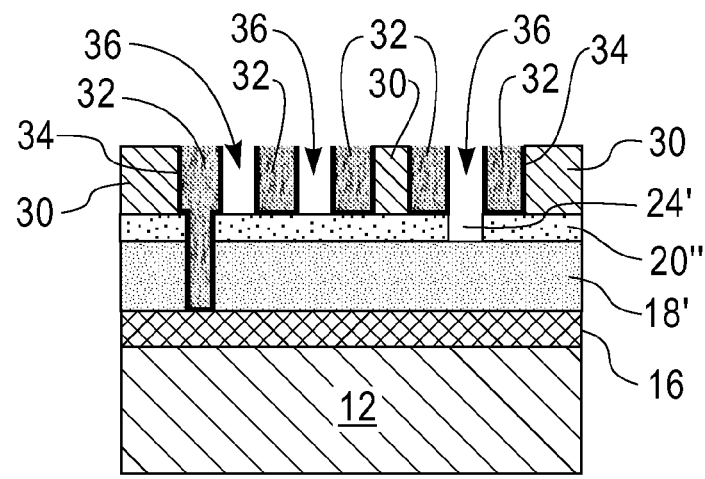

FIG. 5 is a pictorial representation (through a cross sectional view) depicting the structure of FIG. 4 after forming a patterned and cured photo-patternable low k material having a plurality of electrically conductive filled regions and gaps located therein, wherein at least one of the plurality of electrically conductive filled regions is located within the at least one second opening and wherein one of the gaps is located above and connected with the at least one first opening located within the patterned second low k material.

Figure 6:
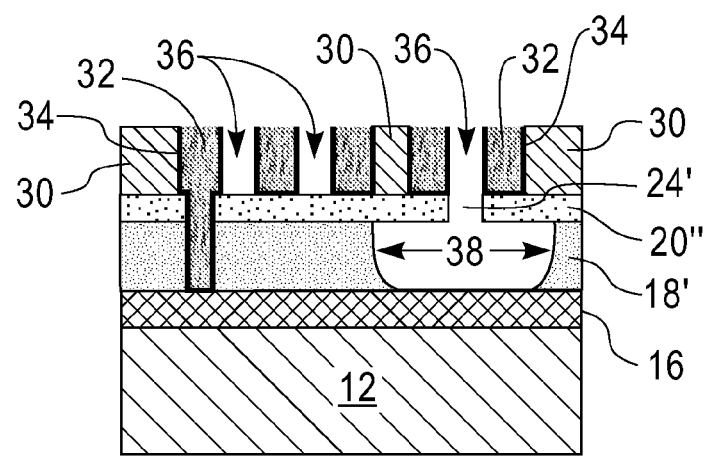

FIG. 6 is a pictorial representation (through a cross sectional view) depicting the structure of FIG. 5 after performing a lateral etching process that forms an expanded width gap within the patterned first low k material which is located beneath and connected with the at least one first opening formed in the second low k dielectric material.

Figure 7:
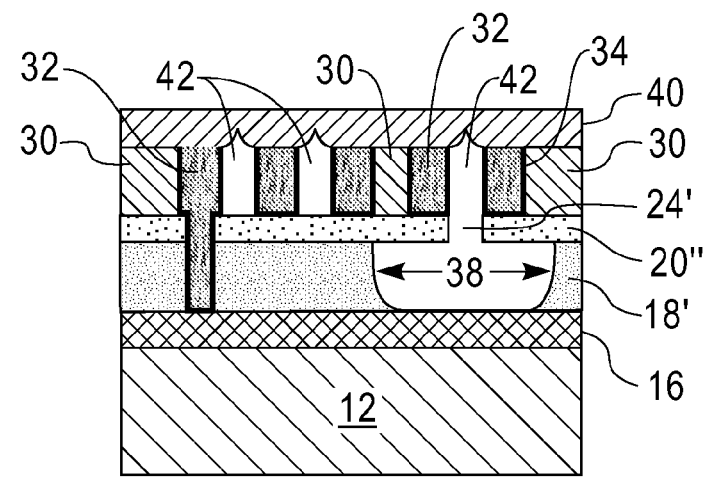

FIG. 7 is a pictorial representation (through a cross sectional view) depicting the structure of FIG. 6 after forming a dielectric cap atop the patterned and cured photo-patternable low k material forming air gaps within the structure.

Figure 8:
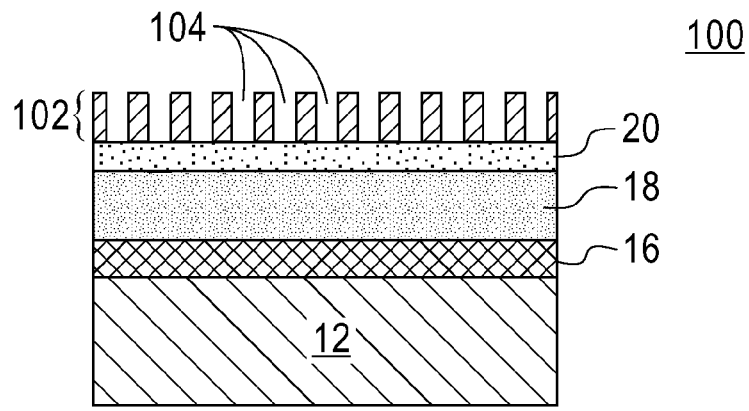

FIG. 8 is a pictorial representation (through a cross sectional view) depicting an initial structure including from bottom to top, a substrate, a material stack, a first low k material, a second low k material and a self-assembled co-polymer mask including a plurality of openings therein that can be employed in another embodiment of the present disclosure.

Figure 9:
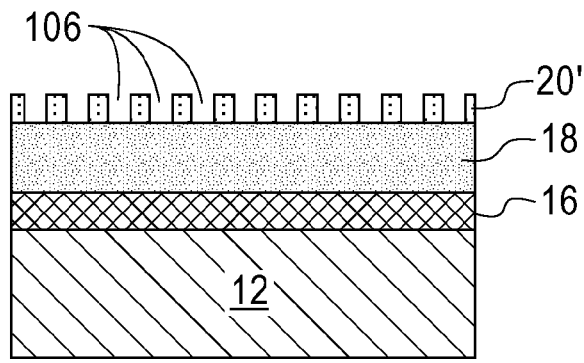

FIG. 9 is a pictorial representation (through a cross sectional view) depicting the initial structure of FIG. 8 after etching exposed portions of the second low k material and removal of the self-assembled co-polymer mask.

Figure 10:
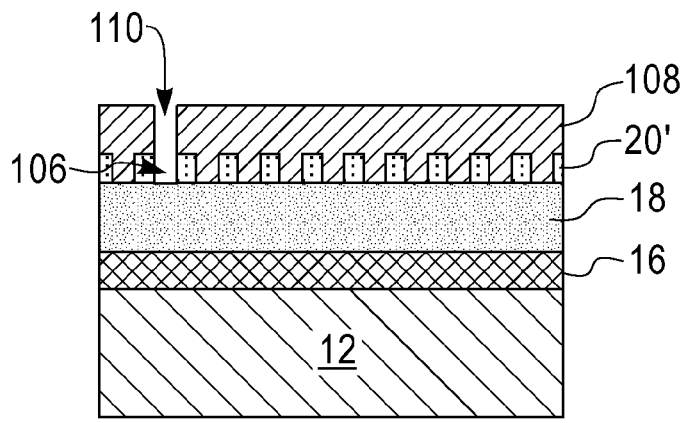

FIG. 10 is a pictorial representation (through a cross sectional view) depicting the structure of FIG. 9 after forming a patterned photoresist having at least one opening therein that exposes at least one opening within the previously etched second low k material.

Figure 11:
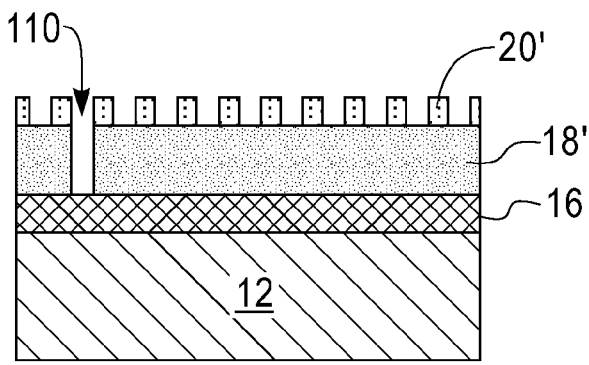

FIG. 11 is a pictorial representation (through a cross sectional view) depicting the structure of FIG. 10 after etching exposed portions of the first low k material and removal of the patterned photoresist.

Figure 12:
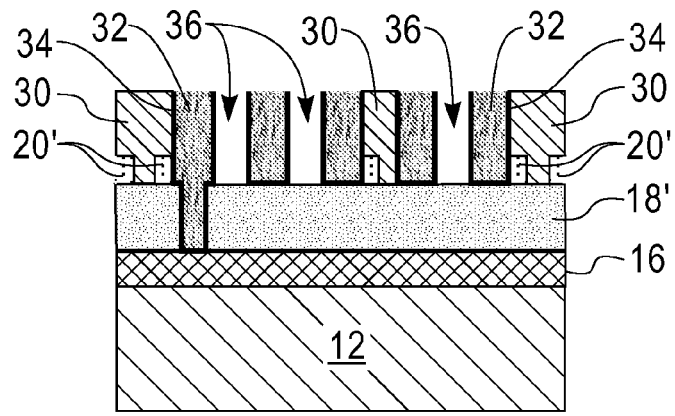

FIG. 12 is a pictorial representation (through a cross sectional view) depicting the structure of FIG. 11 after forming a patterned and cured photo-patternable low k material having a plurality of electrically conductive filled regions and gaps located therein, wherein at least one of the plurality of electrically conductive filled regions is located within an opening that is present in the previously etched portions of the first low k material.

Figure 13:
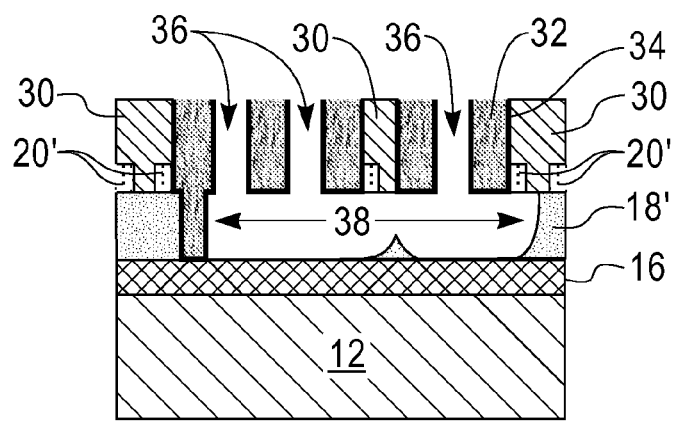

FIG. 13 is a pictorial representation (through a cross sectional view) depicting the structure of FIG. 12 after performing a lateral etch that expands the width of at least one of the gaps.

Figure 14:
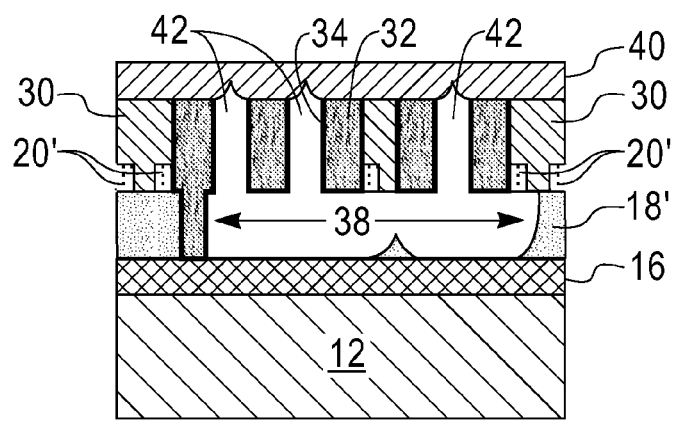

FIG. 14 is a pictorial representation (through a cross sectional view) depicting the structure of FIG. 13 after forming a dielectric cap atop the patterned and cured photo-patternable low k material forming air gaps within the structure.

DETAILED DESCRIPTION

The present invention, which provides air gap-containing interconnect structures and methods of fabricating such air gap-containing interconnect structures, will now be described in greater detail by referring to the following discussion and drawings that accompany the present application. It is observed that the drawings of the present application are provided for illustrative purposes and, as such, the drawings are not drawn to scale.

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, methods for producing a metal-insulator interconnect structure having air gaps for VLSI and ULSI devices using a photo-patternable low k (PPLK) material are disclosed. More particularly, the methods disclosed herein provide interconnect structures including a photo-patternable low k material in which air gaps are defined by photolithography in the photo-patternable low k material. With such methods, no etch step is needed to form the air gaps.

It is noted that the photo-patternable low k materials employed in the invention are any dielectric materials possessing the following two functions. They act as a photoresist during a patterning process and are subsequently converted into a low k dielectric insulator during a post patterning cure process. The cured product of a photo-patternable low k material, therefore, can serve as a permanent on-chip dielectric insulator. The photo-patternable low k material can be deposited from a liquid phase. In the present invention, the terms "cure" or "curing" are used interchangeably to refer to one of the processes selected from a thermal cure, an electron beam cure, an ultra-violet (UV) cure, an ion beam cure, a plasma cure, a microwave cure or a combination thereof. A "cured" product of a photo-patternable low k material is the product of the photo-patternable low k material after it has undergone one of the aforementioned cure processes. The "cured" product of a photo-patternable low k material is different from the photo-patternable low k material in chemical nature and physical, mechanical and electrical properties.

The term "photo-patternable low k material (or PPLK for short)" includes a functionalized polymer, copolymer or blend including at least two of any combination of polymers and/or copolymers having one or more acid-sensitive imageable groups. The PPLK material acts as a photoresist and after curing it is converted from a photoresist into a permanent on-chip dielectric material having a dielectric constant of about 4.3 or less. It is noted that when the PPLK material is comprised of a polymer, the polymer includes at least one monomer (to be described in greater detail below). When the PPLK material is comprised of a copolymer, the copolymer includes at least two monomers (to be described in greater detail below). The blends of polymers and/or copolymers include at least two of any combination of polymers and/or copolymers described below.

In general terms, the PPLK material that can be employed is a photo-patternable composition including a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

More specifically, the PPLK material that can be employed is a photo-patternable composition comprising a photo/acid-sensitive polymer of one monomer or a copolymer of at least two monomers selected from siloxane, silane, carbosilane, oxycarbosilane, organosilicates, silsesquioxanes and the like. The PPLK material may also be a photo-patternable composition comprising a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Additionally, the PPLK material may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Optionally the PPLK material may be photo-patternable composition further comprising at least one microscopic pore generator (porogen). The pore generator may be or may not be photo/acid sensitive.

Illustrative polymers for the PPLK material include, but are not limited to siloxane, silane, carbosilane, oxycarbosilane, silsesquioxane-type polymers including caged, linear, branched or combinations thereof. In one embodiment, the PPLK material is a photo-patternable composition comprising a blend of these photo/acid-sensitive polymers. Examples of PPLK materials that can be employed in this application are disclosed, for example, in U.S. Pat. Nos. 7,041,748, 7,056,840, and 6,087,064, as well as U.S. Patent Application Publication No. 2008/0286467, U.S. Patent Application Publication No. 2009/0233226, U.S. Patent Application Publication No. 2009/0291389, U.S. patent application Ser. No. 12/569,200, filed Sep. 29, 2009 all of which are incorporated herein by reference in their entirety.

The PPLK material is typically formed from a positive-tone photo-patternable composition that includes at least one of the above mentioned polymers, copolymers or blends, a photoacid generator, a base additive and a solvent typically used in a photoresist composition. By "positive-tone" it is meant that the part of the PPLK material that is exposed to photolithography will be removed by a conventional developer, while the unexposed part of the PPLK material is not removed. The photoacid generators, base additives and solvents are well known to those skilled in the art and, as such, details regarding those components are not fully provided.

One method of the present invention which includes the use of the PPLK material described above will now described in greater detail. Reference is first made to FIGS. 1-7 which illustrate an embodiment of the present application. In this illustrated embodiment, a positive-tone PPLK material, as described above, is deposited atop an initial structure including, from bottom to top, a substrate, a material stack, a patterned first low k material and a patterned second low k material. The material stack can include a dielectric cap, an antireflective coating (ARC) or a multilayered stack thereof. Standard interconnect structures are built into the positive-tone PPLK material using standard single or dual damascene methods well known to those skilled in the art. The positive-tone PPLK material maintains its photosensitive property during the interconnect build up. A photolithography step is employed after the interconnect structure build up to define the position of air gaps in-between at least one pair of neighboring electrically conductive filled openings. Since the electrically conductive filled openings are not sensitive to ultra violet radiation, the lithography requirements in terms of the dimension and alignment are relaxed. The positive-tone PPLK material exposed in the lithography step is removed by a conventional developer leaving gaps in-between at least one pair of electrically conductive filled openings. After forming the gaps, the remaining PPLK material is cured forming a patterned and cured permanent low k dielectric including gaps in-between at least one pair of electrically conductive filled openings. A dielectric cap is then formed atop the patterned and cured low k dielectric material sealing off the gaps forming an air gap-containing interconnect structure in which the air gaps are formed within at least the patterned and cured permanent low k dielectric material in-between the at least one pair of electrically conductive filled openings. The air gaps also extend into the patterned second low k material and the patterned first low k material. Within the patterned first low k material, each air gap has an expanded width relative to the width of the corresponding air gap in at least the patterned and cured PPLK material.

Figure 1:
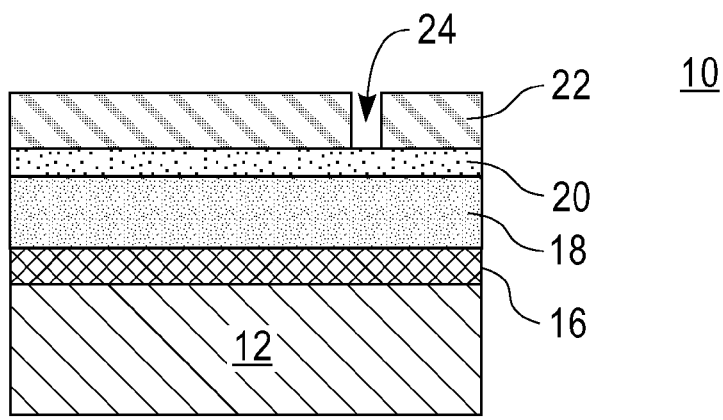
FIG. 1 is a pictorial representation (through a cross sectional view) depicting an initial structure including, from bottom to top, a substrate, a material stack, a first low k material, a second low k material and a first patterned photoresist including at least one first opening therein that can be employed in one embodiment of the present disclosure.

Reference is now made to FIG. 1 which illustrates an initial interconnect structure 10 that can be employed in one embodiment of the invention. The initial interconnect structure 10 of FIG. 1 includes a substrate 12, a material stack 16, a first low k material 18, a second low k material 20 and a first patterned photoresist 22, i.e., patterned mask, having at least one first opening 24 located therein.

The substrate 12 may comprise a semiconducting material, an electrically insulating material, an electrically conductive material, devices or structures made of these materials or any combination thereof (e.g., a lower level of an interconnect structure). When the substrate 12 is comprised of a semiconducting material, any semiconductor such as Si, SiGe, SiGeC, SiC, Ge alloys, GaAs, InAs, InP and other III/V or II/VI compound semiconductors, or organic semiconductors may be used. The substrate 12 may also be a flexible substrate containing devices that are suitable for high-speed roll-to-roll processing. In addition to these listed types of semiconducting materials, substrate 12 may also be a layered semiconductor such as, for example, Si/SiGe, Si/SiC, silicon-on-insulators (SOIs) or silicon germanium-on-insulators (SGOIs). These semiconductor materials may form a device, or devices or structures, which may be discrete or interconnected. These devices and device structures may be for computation, transmission, storage or display of information, such as logic devices, memory devices, switches or display devices. In some embodiments, one or more semiconductor devices such as, for example, complementary metal oxide semiconductor (CMOS) devices, strained silicon devices, carbon-based (e.g., carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated on the semiconducting material.

When the substrate 12 is an electrically insulating material, the insulating material can be an organic insulator, an inorganic insulator or a combination thereof including multilayers. The electrically insulating materials may be part of a device, or devices or structures, which may be discrete or interconnected. These devices and structures may be for logic applications or memory applications.

When the substrate 12 is an electrically conducting material, the substrate may include, for example, polySi, an elemental metal, an alloy including at least one elemental metal, a metal silicide, a metal nitride, carbon nanotubes, graphene or combinations thereof including multilayers.

In yet other embodiments, substrate 12 can be composed of one of the antireflective coating materials described herein below.

Atop the substrate 12 is a material stack 16 that may include a dielectric cap, an antireflective coating, or a multi-layered stack thereof. When present, the dielectric cap of material stack 16 is formed directly on the surface of substrate 12 utilizing a standard deposition process such as, for example, chemical vapor deposition (CVD), plasma enhanced chemical vapor deposition (PECVD), atomic layer deposition (ALD), chemical solution deposition, or evaporation. The dielectric cap comprises any suitable dielectric capping material such as, for example, SiC, SiN, $SiO_2$, a carbon doped oxide, a nitrogen and hydrogen doped silicon carbide SiC(N,H) or multilayers thereof. The dielectric cap can be a continuous layer or a discontinuous layer. The dielectric cap can be a layer with graded composition in the vertical direction. It can also be a select cap, such as CoWP.

A post deposition treatment may be applied to the dielectric cap to modify the properties of either the entire layer or the surface of the dielectric cap. This post deposition treatment can be selected from heat treatment, irradiation of electromagnetic wave (such of ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The purpose of the post deposition treatment is to enhance the chemical, physical, electrical, and/or mechanical properties of the dielectric cap, such as adhesion strength. The chemical properties include the nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The heat treatment should be no higher than the temperature that the underlying substrate can withstand, usually 500° C. This heat treatment can be conducted in an inert environment or within a chemical environment in a gas phase or a liquid phase. This treatment step may or may not be performed in the same tool as that used in forming the optional dielectric cap.

The post deposition treatment by irradiation of electromagnetic wave can be by ultra-violet (UV) light, microwave and the like. The UV light can be broadband with a wavelength range from 100 nm to 1000 nm. It can also be UV light generated by an excimer laser or other UV light source. The UV treatment dose can be a few $mJ/cm^2$ to thousands of $J/cm^2$. This irradiation treatment can be conducted at ambient temperature or at an elevated temperature no higher than 500° C. This irradiation treatment can be conducted in an inert environment or within a chemical environment in a gas phase or a liquid phase. The following conditions can be employed for this aspect of the present disclosure: a radiation time from 10 sec to 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the dielectric cap.

The post deposition treatment by plasma treatment can be selected from an oxidizing plasma, a reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to 400° C. can be employed. This treatment step may or may not be performed in the same tool as that used in forming the dielectric cap.

The post deposition chemical treatment may be conducted in a gas phase or a liquid phase. The following conditions may be employed for this aspect of the present invention: a treatment time from 1 sec to 30 min, a temperature from room temperature (i.e., from 20° C. to 30° C.) to 500° C. Chemicals suitable for this chemical treatment may be selected from any chemicals that improve chemical, physical, electrical, and/or mechanical properties of the dielectric cap layer, such as adhesion strength. This chemical treatment may penetrate the entire optional dielectric cap or is limited only to the surface of the optional dielectric cap. Example chemicals include adhesion promoters such as silanes, siloxanes and silylation agents. This treatment step may or may not be performed in the same tool as that used in forming the dielectric cap.

The thickness of the dielectric cap may vary depending on the technique used to form the same as well as the material make-up of the layer. Typically, the dielectric cap has a thickness from 1 nm to 100 nm, with a thickness from 20 nm to 45 nm being more typical.

The antireflective coating (ARC) of material stack 16 can be formed on a surface of the dielectric cap if present, or directly on a surface of the substrate 12 when the dielectric cap is not present. Although, the ARC is optional, it is typically present when at least one of the overlying layers (e.g., the first low k material, the second low k material or the PPLK material) serves as a photoresist material. The ARC employed has all of the following general characteristics: (i) It acts as an ARC during a lithographic patterning process; (ii) It withstands high-temperature BEOL integration processing (up to 500° C.); (iii) It prevents poisoning of at least one of the overlying layers that serve as a photoresist (e.g., the first low k material, the second low k material and/or the PPLK material) by the substrate; (iv) It provides vertical wall profile and sufficient etch selectivity between one of the overlying layers (e.g., the first low k material, the second low k material and the PPLK material) and the ARC layer; (v) It serves as a permanent dielectric layer in a chip (low dielectric constant, preferably k<5, more preferably k<3.6); and (vi) It is compatible with conventional BEOL integration and produces reliable hardware.

Further discussion is now provided for characteristics (i)-(v).

Characteristic (i) the ARC acts as an antireflective coating (ARC) during a lithographic patterning process: ARC may be designed to control reflection of light that is transmitted through a photoresist material such as one of the low k materials or the PPLK material employed in the present invention, reflected off the substrate 12 and back into the photoresist material, where it can interfere with incoming light and cause the photoresist material to be unevenly exposed. The ARC's optical constants are defined here as the index of refraction n and the extinction coefficient k. In general, ARC can be modeled so as to find optimum optical parameters (n and k values) of the ARC as well as optimum thickness. The preferred optical constants of ARC are in the range from n=1.2 to n=3.0 and k=0.01 to k=0.9, preferably n=1.4 to n=2.6 and k=0.02 to k=0.78 at a wavelength of 365, 248, 193 and 157, 126 nm and extreme ultraviolet (13.4 nm) radiation. The optical properties and thickness of the ARC are optimized to obtain optimal resolution, profile control and to maximize the process window of the photoresist material during the subsequent patterning steps, which is well known to those ordinarily skilled in the art.

Characteristic (ii) the ARC can withstand high-temperature BEOL integration processing (up to 500° C.): The ARC must withstand the harsh processing conditions during BEOL integration. These include high temperature and intense UV cure. The process temperature can be as high as 450° C. The intensity of the light used in the UV cure process can be as high as tens of $J/cm^2$.

Characteristic (iii) the ARC prevents photoresist material poisoning by the substrate: At least the PPLK material and optionally the low k materials employed herein include a chemically amplified resist. They can be poisoned by any basic containment from the underlying substrate, such as a SiCN cap layer. The ARC must serve as a barrier layer to prevent basic contaminant from the underlying substrate from diffusing into the photoresist material to poison the same.

Characteristic (iv) the ARC provides vertical wall profile and sufficient etch selectivity between the photoresist material and the ARC layer: the ARC should provide sufficient reflectivity control with reflectivity from the underlying substrate under a particular lithographic wavelength of less than 8%, preferably less than 5%, more preferably less than 2% and generate vertical side wafer profile. The ARC should also generate residue-free patterns with no footing. Moreover, the adhesion of the photoresist material should be sufficient to prevent pattern collapse. The ARC should also be designed such that the etch selectivity during a subsequent ARC/cap open process is sufficiently high so that the opening of the ARC/cap stack does not erode a significant portion of the photoresist material and degrade significantly its pattern profile. An etch selectivity (etch rate ratio of ARC/cap versus photoresist material) is greater than 1, preferably greater than 3, more preferable greater than 5.

Characteristic (v) the ARC serves as a permanent dielectric layer in a chip: The ARC remains after forming the air gaps and thus serves as a permanent dielectric layer in a chip. Therefore, ARC must meet the requirements of an on-chip dielectric insulator, including electrical properties (low dielectric constant: preferably k less than 5, and more preferably k less than 3.6; dielectric breakdown field: greater than 2 MV/cm, preferably greater than 4 MV/cm, and more preferably greater than 6 MV/cm, leakage: less than $10^{-5}$ $A/cm^2$, preferably less than $10^{-7}$ $A/cm^2$, and more preferably less than $10^{-9}$ $A/cm^2$); mechanical properties (adhesion energy is equal to or greater than the cohesive energy of the weakest layer of the integrated film stack); and the ARC employed must pass electrical and mechanical reliability tests.

The thickness of the ARC may vary depending on the technique used to form the same as well as the material make-up of the layer. Typically, the ARC has a thickness from 1 nm to 200 nm, with a thickness from 10 nm to 140 nm being more typical. The ARC may be inorganic or a hybrid of inorganic and organic. The ARC may be a single layer or multilayer. It may also be a graded ARC with graded composition in the vertical direction.

Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may be employed as the ARC and may be deposited, for example, by plasma-enhanced chemical vapor deposition, spin-on techniques, spray coating, dip coating, etc. The ARC may be a single layer or multilayer. When the ARC is a multilayer ARC, the deposition of each layer may be the same or a combination of deposition methods can be used. The chemical composition of the ARC may be uniform or graded along the vertical direction. After applying the ARC particularly those from a liquid phase, a post deposition baking step is usually required to remove unwanted components, such as solvent, and to effect crosslinking. The post deposition baking step of the ARC is typically, but not necessarily always, performed at a temperature from 80° C. to 300° C., with a baking temperature from 120° C. to 200° C. being more typical.

In some embodiments, the as-deposited ARC may be subjected to a post deposition treatment to improve the properties of the entire layer or the surface of the ARC. This post deposition treatment can be selected from heat treatment, irradiation of electromagnetic wave (such as ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The purpose of this post deposition treatment is to enhance the chemical, physical, electrical, and/or mechanical properties of the ARC and/or the film stack, such as adhesion strength. The chemical properties include nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The conditions described above for the post treatment of the dielectric cap may be used for the post treatment for the ARC.

In one embodiment, the ARC that is employed is an inorganic composition that includes elements of M, C (carbon) and H (hydrogen), wherein M is selected from at least one of the elements of Si, Ge, B, Sn, Fe, Ta, Ti, Ni, Hf and La. Such an ARC is described for example in U.S. Patent Publication No. 2009/0079076 the entire content of which is incorporated herein by reference. This inorganic ARC may optionally include elements of O, N, S, F or mixtures thereof. In some embodiments, M is preferably Si. In some embodiments, the ARC composition may also be referred to as a vapor deposited M:C:H: optionally X material, wherein M is as defined above, C and H are carbon and hydrogen element, respectively, and X is at least one element of O, N, S and F.

In one embodiment, the ARC is produced by a vapor or liquid phase deposition (such as, for example, CVD, PECVD, PVD, ALD and spin-on coating) method using appropriate precursors or combination of precursors containing elements described above.

In a preferred embodiment, the ARC is a Si:C:H:X film. These Si containing films are deposited from at least one Si containing precursor. More particularly, the Si:C:H:X films are deposited from at least one Si containing precursor with, or without, additions of nitrogen and/or oxygen and/or fluorine and/or sulfur containing precursors. The Si containing precursor that is employed can comprise any Si containing compound including molecules selected from silane ($SiH_4$) derivatives having the molecular formula $SiR_4$, cyclic Si containing compounds including cyclocarbosilane where the R substitutents may or may not be identical and are selected from H, alkyl, phenyl, vinyl, allyl, alkenyl or alkynyl groups that may be linear, branched, cyclic, polycyclic and may be functionalized with nitrogen containing substituents, any cyclic Si containing compounds including cyclosilanes, and cyclocarbosilanes.

Preferred Si precursors include, but are not limited to silane, methylsilane, dimethylsilane, trimethylsilane, tetramethylsilane, ethylsilane, diethylsilane, triethylsilane, tetraethylsilane, ethylmethylsilane, triethylmethylsilane, ethyldimethylsilane, ethyltrimethylsilane, diethyldimethylsilane, 1,1,3,3,-tetrahydrido-1,3-disilacyclobutane; 1,3-disilacyclobutane; 1,3-dimethyl-1,3-dihydrido-1,3-disilylcyclobutane; 1,1,3,3, tetramethyl-1,3-disilacyclobutane; 1,1,3,3,5,5-hexahydrido-1,3,5-trisilane; 1,1,3,3,5,5-hexamethyl-1,3,5-trisilane; 1,1,1,4,4,4,-hexahydrido-1,4-disilabutane; and 1,4-bis-trihydrosilyl benzene. Also the corresponding meta substituted isomers, such as dimethyl-1-propyl-3-silabutane; 2-silapropane, 1,3-disilacyclobutane, 1,3-disilapropane, 1,5-disilapentane, or 1,4-bis-trihydrosilyl benzene can be employed.

A single precursor such as silane amine, $Si(Net)_4$, can be used as the silicon, carbon and nitrogen source. Another preferred method is a mixture of precursors, a Si containing source such as silane, disilane, or a alkylsilane such as tetramethylsilane, or trimethylsilane, and a nitrogen containing source such as ammonia, amines, nitriles, aminos, azidos, azos, hydrizos. An additional carbon source and/or carbon and nitrogen containing source comprised of a linear, branched, cyclic or polycyclic hydrocarbon backbone of —$[CH_2]_n$—, where n is greater than or equal to 1, and may be substituted by functional groups selected from alkenes (—C=C—), alkynes (—C≡C—), amines (—C—N—), nitriles (—C≡N), amino (—$NH_2$), azido (—N=N=N—) and azo (—N=N—) may also be required. The hydrocarbon backbone may be linear, branched, or cyclic and may include a mixture of linear branched and cyclic hydrocarbon moieties. These organic groups are well known and have standard definitions that are also well known in the art. These organic groups can be present in any organic compound.

In some embodiments, the method may further include the step of providing a parallel plate reactor, which has an area of a substrate chuck from 85 $cm^2$ to 750 $cm^2$, and a gap between the substrate and a top electrode from 1 cm to 12 cm. A high frequency RF power is applied to one of the electrodes at a frequency from 0.45 MHz to 200 MHz. Optionally, an additional RF power of lower frequency than the first RF power can be applied to one of the electrodes. A single source precursor or a mixture of precursors which provide a silicon, carbon and nitrogen source are introduced into a reactor.

The conditions used for the deposition step may vary depending on the desired final properties of the ARC. Broadly, the conditions used for providing the ARC comprising elements of Si:C:H:X, include: setting the substrate temperature within a range from 100° C. to 700° C.; setting the high frequency RF power density within a range from 0.1 $W/cm^2$ to 2.0 $W/cm^2$; setting the gas flow rates within a range from 5 sccm to 10000 sccm; setting the inert carrier gases, such as helium (or/and argon) flow rate within a range from 10 sccm to 10000 sccm; setting the reactor pressure within a range from 1 Torr to 10 Torr; and setting the high frequency RF power within a range from 10 W to 1000 W. Optionally, a lower frequency power may be added to the plasma within a range from 10 W to 600 W. When the conductive area of the substrate chuck is changed by a factor of X, the RF power applied to the substrate chuck is also changed by a factor of X. Gas flows of silane, carbon and/or nitrogen gas precursors are flowed into the reactor at a flow rate within a range from 10 sccm to 1000 sccm. While gas precursors are used in the above example, liquid precursors may also be used for the deposition.

The atomic % ranges for M in such ARC materials are as follows: preferably 0.1 atomic % to 95 atomic %, more preferably 0.5 atomic % to 95 atomic %, most preferably 1 atomic % to 60 atomic % and most highly preferably 5 atomic % to 50 atomic %. The atomic % ranges for C in the ARC are as follows: preferably 0.1 atomic % to 95 atomic %, more preferably 0.5 atomic % to 95 atomic %, most preferably 1 atomic % to 60 atomic % and most highly preferably 5 atomic % to 50 atomic %. The atomic % ranges for H in the ARC are as follows: preferably 0.1 atomic % to 50 atomic %, more preferably 0.5 atomic % to 50 atomic %, most preferably 1 atomic % to 40 atomic % and most highly preferably 5 atomic % to 30 atomic %. The atomic % ranges for X in the ARC are as follows: preferably 0 atomic % to 70 atomic %, more preferably 0.5 atomic % to 70 atomic %, most preferably 1 atomic % to 40 atomic % and most highly preferably 5 atomic % to 30 atomic %.

The ARC including elements of M, C and H may have a tunable index of refraction and extinction coefficient which can be optionally graded along the film thickness to match the optical properties of the substrate and the photoresist to be formed directly on it. Thus, the optical properties and the lithographic features of the ARC are superior to those obtained by conventional single layer ARC. The ARC's optical constants are defined here as the index of refraction n and the extinction coefficient k.

The ARC including elements of M, C and H can be deposited also in a parallel plate PECVD reactor with the substrate positioned on the grounded electrode. In some embodiments, the ARC can be deposited at a substrate temperature up to 400° C., and in a high-density plasma type reactor under suitable chosen conditions. It should be noted that by changing process parameters such as bias voltage, gas mixture, gas flow, pressure and deposition temperature, the film's optical constants can be changed. In addition, the composition of the starting precursor as well as the introduction of oxygen, nitrogen, fluorine, and sulfur containing precursors also allows the tunability of these films.

In another embodiment, the ARC that is employed is formed by a liquid deposition process including for example, spin-on coating, spray coating, dip coating, brush coating, evaporation or chemical solution deposition. This ARC formed by liquid deposition comprises a polymer that has at least one monomer unit comprising the formula $M-R^A$ wherein M is at least one of the elements of Si, Ge, B, Sn, Fe, Ta, Ti, Ni, Hf and La and $R^A$ is a chromophore. Such an ARC is described in U.S. Patent Publication No. 2009/0081418 the entire content of which is incorporated herein by reference. In some embodiments, M within the monomer unit may also be bonded to organic ligands including elements of C and H, a cross-linking component, another chromophore or mixtures thereof. The organic ligands may further include one of the elements of O, N, S and F. When the organic ligand is bonded to M, it is bonded to M' through C, O, N, S, or F.

In other embodiments, the ARC formed by liquid deposition may also include at least one second monomer unit, in addition to the at least one monomer unit represented by the formula $M-R^A$. When present, the at least one second monomer unit has the formula $M'-R^B$, wherein M' is at least one of the elements of Si, Ge, B, Sn, Fe, Ta, Ti, Ni, Hf and La, and $R^B$ is a cross-linking agent. M and M' may be the same or different elements. In these two formulae, M and M' within the monomer unit may be also be bonded to organic ligands including atoms of C and H, a cross-linking component, a chromophore or mixtures thereof. The organic ligands may further include one of the elements of O, N, S and F. When the organic ligand is bonded to M and M', it is bonded to M or M' through C, O, N, S, or F.

The liquid ARC composition comprising $M-R^A$ or $M-R^A$ and $M'-R^B$ may also comprise at least one additional component, including a separate crosslinker, an acid generator or a solvent. When liquid deposition is employed, the ARC is formed by liquid phase deposition of a liquid composition that includes an inorganic precursor that includes element of M, C and H, wherein M is at least one of the elements of Si, Ge, B, Sn, Fe, Ta, Ti, Ni, Hf and La. The inorganic precursor used in forming the ARC may optionally include elements of O, N, S, F or mixtures thereof. In some embodiments, M is preferably Si. The liquid composition also includes, in addition to the inorganic precursor, a chromophore, a cross-linking component, an acid generator and solvent.

One embodiment of the inorganic ARC composition used in the liquid deposition embodiment comprises $M-R^A$ and $M'-R^B$ units, wherein M and M' are at least one of the elements of Si, Ge, B, Sn, Fe, Ta, Ti, Ni, Hf and La or are selected from Group IIIB to Group VIB, Group IIIA, and Group IVA. The inorganic precursor used in forming the ARC may optionally include elements of O, N, S, F or mixtures thereof. One embodiment of the ARC composition comprises the $MO_y$ unit which can be any one of many different metal-oxide forms. An exemplary list of such metal-oxide forms for a particular metal is as follows: $MO_3$; wherein M is Sc, Y, lanthanide, and Group IIIA; B, Al, Ga or In; $MO_4$; wherein M is Group IVB; Ti, Zr or Hf, and Group IVA; Sn or Ge; $MO_5$; wherein M is Group VB; V, Nb or Ta; or P. The Group VB metals are also known to form stable metal oxo forms, $LMO_3$, wherein L is an oxo; LMO; many of the listed metals form stable acetoacetato-metal complexes; LMO; many of the listed metals form stable cyclopentadienyl-metal complexes; LMO; wherein L is an alkoxy ligand; M is Sc, Y, or lanthanide, Group IVB, and Group VB; or LMO; wherein L is an alkyl or phenyl ligand; M is Group IIIA or Group IVA.

The chromophore, cross-linking component and acid generator that can be used in the liquid deposited ARC are defined in greater detail with respect to the following preferred embodiment of the present invention. In a preferred embodiment, the ARC formed by liquid deposition is characterized by the presence of a silicon-containing polymer having units selected from a siloxane, silane, carbosilane, oxycarbosilane, silsesquioxane, alkyltrialkoxysilane, tetra-alkoxysilane, or silicon-containing and pendant chromophore moieties. The polymer containing these units may be a polymer containing these units in the polymer backbone and/or in pendant groups. Preferably, the polymer contains the preferred units in its backbone. The polymer is preferably a polymer, a copolymer, a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The polymer should be soluble to form a solution and have film-forming characteristics conducive to forming an ARC by conventional spin-coating. In addition to the chromophore moieties discussed below, the silicon-containing polymer also preferably contains a plurality of reactive sites distributed along the polymer for reaction with the cross-linking component.

Examples of suitable polymers include polymers having the silsesquioxane (ladder, caged, or network) structure. Such polymers preferably contain monomers having structures (I) and (II) below:

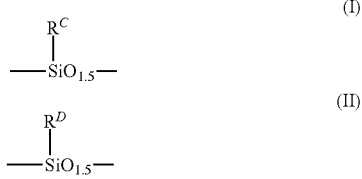

where $R^C$ comprises a chromophore and $R^D$ comprises a reactive site for reaction with the cross-linking component.

Alternatively, general linear organosiloxane polymers containing monomers (I) and (II) can also be used. In some cases, the polymer contains various combinations of monomers (I) and (II) including linear structures such that the average structure for $R^C$-containing monomers may be represented as structure (III) below and the average structure for $R^D$-containing monomers may be represented by structure (IV) below:

where x is from 1 to 1.5. In theory, x may be greater than 1.5, however, such compositions generally do not possess characteristics suitable for spin-coating processes (e.g., they form undesirable gel or precipitate phases).

Generally, silsesquioxane polymers are preferred. If the ordinary organosiloxane polymers are used (e.g., monomers of linear structures (I) and (III)), then preferably, the degree of cross-linking is increased compared to formulations based on silsesquioxanes.

The chromophore-containing groups $R^C$ (or $R^A$ in the generic description above) may contain any suitable chromophore which (i) can be grafted onto the silicon-containing polymer (or M moiety of the generic monomer defined above) (ii) has suitable radiation absorption characteristics at the imaging wavelength, and (iii) does not adversely affect the performance of the layer or any overlying layers.

Preferred chromophore moieties include benzene and its derivatives, chrysenes, pyrenes, fluoranthrenes, anthrones, benzophenones, thioxanthones, and anthracenes. Anthracene derivatives, such as those described in U.S. Pat. No. 4,371,605 may also be used; the disclosure of this patent is incorporated herein by reference. In one embodiment, phenol, hydroxystyrene, and 9-anthracene methanol are preferred chromophores. The chromophore moiety preferably does not contain nitrogen, except for possibly deactivated amino nitrogen such as in phenol thiazine.

The chromophore moieties may be chemically attached by acid-catalyzed O-alkylation or C-alkylation such as by Friedel-Crafts alkylation. The chromophore moieties may also be chemically attached by hydrosilylation of SiH bond on the parent polymer. Alternatively, the chromophore moiety may be attached by an esterification mechanism. A preferred acid for Friedel-Crafts catalysis is HCl.

Preferably, 15 to 40% of the functional groups contain chromophore moieties. In some instances, it may be possible to bond the chromophore to the monomer before formation of the silicon-containing polymer. The site for attachment of the chromophore is preferably an aromatic group such as a hydroxybenzyl or hydroxymethylbenzyl group. Alternatively, the chromophore may be attached by reaction with other moieties such as cyclohexanol or other alcohols. The reaction to attach the chromophore is preferably an esterification of the alcoholic OH group.

$R^D$ (or $R^B$ in the generic description above) comprises a reactive site for reaction with a cross-linking component. Preferred reactive moieties contained in $R^D$ are alcohols, more preferably aromatic alcohols (e.g., hydroxybenzyl, phenol, hydroxymethylbenzyl, etc.) or cycloaliphatic alcohols (e.g., cyclohexanoyl). Alternatively, non-cyclic alcohols such as fluorocarbon alcohols, aliphatic alcohols, amino groups, vinyl ethers, and epoxides may be used.

Preferably, the silicon-containing polymer (before attachment of the chromophore) of a liquid deposited ARC is poly (4-hydroxybenzylsilsesquioxane). Examples of other silsesquioxane polymers include: poly(p-hydroxyphenylethylsilsesquioxane), poly(p-hydroxyphenylethylsilsesquioxane-co-p-hydroxy-alpha-methylbenzylsilsesquioxane), poly(p-hydroxyphenylethylsilsesquioxane-co-methoxybenzylsilsesquioxane), poly(p-hydroxyphenylethylsilsesquioxane-co-t-butylsilsesquioxane), poly(p-hydroxyphenylethylsilsesquioxane-co-cyclohexylsilsesquioxane), poly(p-hydroxyphenylethylsilsesquioxane-co-phenylsilsesquioxane), poly(p-hydroxyphenylethylsilsesquioxane-co-bicycloheptylsilsesquioxane), poly(p-hydroxy-alpha-methylbenzylsilsesquioxane), poly(p-hydroxy-alpha-methylbenzylsilsesquioxane-co-p-hydroxybenzylsilsesquioxane), poly(p-hydroxy-alpha-methylbenzylsilsesquioxane-co-methoxybenzylsilsesquioxane), poly(p-hydroxy-alpha-methylbenzylsilsesquioxane-co-t-butylsilsesquioxane), poly (p-hydroxy-alpha-methylbenzylsilsesquioxane-co-cyclohexylsilsesquioxane), poly(p-hydroxy-alpha-methylbenzylsilsesquioxane-co-phenylsilsesquioxane), poly (p-hydroxy-alpha-methylbenzylsilsesquioxane-co-bicycloheptylsilsesquioxane), poly(p-hydroxybenzylsilsesquioxane-co-p-hydroxyphenylethylsilsesquioxane), and poly(p-hydroxy-alpha-methylbenzylsilsesquioxane-co-alpha-methylbenzylsilsesquioxane).

The Si containing polymers that can be used in a liquid deposited ARC preferably have a weight average molecular weight, before reaction with the cross-linking component, of at least 1000, more preferably a weight average molecular weight of 1000-10000.

The cross-linking component of the liquid deposited ARC is preferably a crosslinker that can be reacted with an SiO containing polymer in a manner which is catalyzed by generated acid and/or by heating. This cross-linking component can be inorganic or organic in nature. It can be a small compound (as compared with a polymer or copolymer) or a polymer, a copolymer, or a blend including at least two of any combination of polymers and/or copolymers, wherein the polymers include one monomer and the copolymers include at least two monomers. Generally, the cross-linking component used in the liquid deposited antireflective coating compositions may be any suitable cross-linking agent known in the negative photoresist art which is otherwise compatible with the other selected components of the composition. The cross-linking agents preferably act to crosslink the polymer component in the presence of a generated acid. Preferred cross-linking agents are glycoluril compounds such as tetramethoxymethyl glycoluril, methylpropyltetramethoxymethyl glycoluril, and methylphenyltetramethoxymethyl glycoluril, available under the POWDERLINK trademark from American Cyanamid Company. Other possible cross-linking agents include: 2,6-bis(hydroxymethyl)-p-cresol, compounds having the following structures:

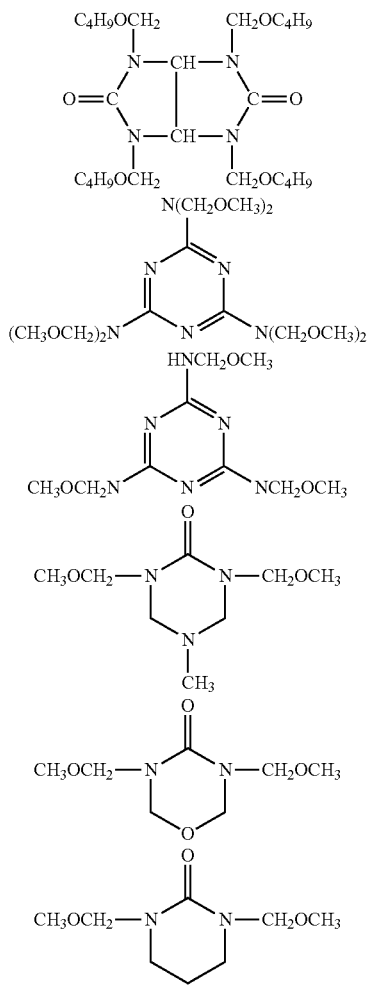

including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547. Other cross-linking agents such as bis-epoxies or bis-phenols (e.g., bisphenol-A) may also be used. Combinations of cross-linking agents may be used. The cross-linking component may be chemically bonded to the Si containing polymer backbone.

In another embodiment, the cross-linking component is a silicon-containing polymer having at least one unit selected from a siloxane, silane, carbosilane, oxycarbosilane, silsesquioxane, alkyltrialkoxysilane, and tetra-alkoxysilane. The polymer is preferably a polymer, a copolymer, a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The acid generator used in the liquid deposited ARC composition is preferably an acid generator compound that liberates acid upon thermal treatment. A variety of known thermal acid generators are suitably employed such as, for example, 2,4,4,6-tetrabromocyclohexadienone, benzoin tosylate, 2-nitrobenzyl tosylate and other alkyl esters of organic sulfonic acids, blocked alkyl phosphoric acids, blocked perfluoroalkyl sulfonic acids, alkyl phosphoric acid/amine complexes, perfluoroalkyl acid quats wherein the blocking can be by covalent bonds, amine and quaternary ammonium. Compounds that generate a sulfonic acid upon activation are generally suitable. Other suitable thermally activated acid generators are described in U.S. Pat. Nos. 5,886,102 and 5,939,236; the disclosures of these two patents are incorporated herein by reference. If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939,236. Other radiation-sensitive acid generators known in the resist art may also be used as long as they are compatible with the other components of the antireflective composition. Where a radiation-sensitive acid generator is used, the cure (cross-linking) temperature of the composition may be reduced by application of appropriate radiation to induce acid generation which in turn catalyzes the cross-linking reaction. Even if a radiation-sensitive acid generator is used, it is preferred to thermally treat the composition to accelerate the cross-linking process (e.g., for wafers in a production line).

The antireflective coating compositions used in the liquid deposition process preferably contain (on a solids basis) in a suitable solvent commonly known to those skilled in the art (i) from 10 wt % to 98 wt. % of a polymer including M, more preferably from 70 wt. % to 80 wt. %, (ii) from 1 wt % to 80 wt. % of cross-linking component, more preferably from 3 wt. % to 25%, most preferably from 5 wt. % to 25 wt. %, and (iii) from 1 wt. % to 20 wt. % acid generator, more preferably 1 wt. % to 15 wt. %.

After liquid depositing the ARC, a post deposition baking step is typically, but not necessarily always, used to remove unwanted components, such as solvent, and to effect crosslinking. When performed, the baking step is conducted at a temperature from 60° C. to 400° C., with a baking temperature from 80° C. to 300° C. being even more preferred. The duration of the baking step varies and is not critical to the practice of the present invention. The baked and previously liquid deposited ARC may further undergo a post curing treatment process. This post curing treatment may include one of the post treatments used above for the optional dielectric cap. As such, the various post treatments and conditions used above in treating the optional dielectric cap are incorporated herein by reference.

In addition, the composition of the starting precursor used in liquid deposition as well as the introduction of oxygen, nitrogen, fluorine containing precursors also allows the tunability of these films. In either embodiment mentioned above, the ARC's optical constants are defined here as the index of refraction n and the extinction coefficient k. In general, the ARC can be modeled so as to find optimum optical parameters (n and k values) of ARC as well as optimum thickness. The preferred optical constants of the ARC are in the range from n=1.4 to n=2.6 and k=0.01 to k=0.78 at a wavelength of 248, 193 and 157, 126 nm and extreme ultraviolet (13.4 nm) radiation.

In addition to the above, the ARC in any embodiment has good etch selectivity during pattern transfer. Etch selectivities of 1.5-4 to 1 of the ARC to the cured dielectric materials can be obtained. Furthermore, the use of the ARC of described above (vapor or liquid deposited) maintains the pattern and structural integrity after curing of the patterned dielectric materials. This is critical as the ARC is retained as a permanent part of the final interconnect stack.

In some embodiments of the invention, the dielectric cap and the ARC of material stack 16 can be combined into a graded cap that includes properties of both a dielectric cap layer and an ARC. Such a graded cap includes at least a lower region that includes elements of a dielectric cap and an upper region that includes elements of an ARC. The graded cap can be formed utilizing any of the methods mentioned above in forming the dielectric cap and/or ARC.

After forming the material stack 16 on an upper surface of substrate 12, a first low k material 18 is formed on an uppermost surface of the material stack 16, and then a second low k material 20 is formed on an upper exposed surface of the first low k material 18. The first low k material 18 and the second low k material 20 are comprised of different dielectric materials each having a dielectric constant of less than 4.0, typically less than 3.8. The different dielectric materials have different etch rates associated therewith as is understood by those skilled in the art. Illustrative examples of low k materials that can be employed as the first low k material 18 and the second low k material 20 include, but are not limited to, silsesquioxanes, C doped oxides (i.e., organosilicates) that include atoms of Si, C, O and H, thermosetting polyarylene ethers, doped silicate glass materials, and cured PPLK materials as described above. In some embodiments, the cured PPLK material can be derived from a positive-tone or negative-tone PPLK composition. The term "polyarylene" is used in this disclosure to denote aryl moieties or inertly substituted aryl moieties which are linked together by bonds, fused rings, or inert linking groups such as, for example, oxygen, sulfur, sulfone, sulfoxide, carbonyl and the like. In some embodiments of the present disclosure, at least one of the first and second low k materials (18, 20) is composed of one of the ARC materials mentioned above.

The thickness of the first and second low k materials (18, 20) may vary depending on the material employed for each of the layers as well as the technique that was used in forming the same. Typically, the first and second low k materials (18, 20) have a thickness from 5 nm to 2 µm, with a thickness from 50 nm to 500 nm being more typical. The first and second low k materials (18, 20) can be formed utilizing any conventional deposition process including, but not limited to, chemical vapor deposition, plasma enhanced chemical vapor deposition, evaporation, chemical solution deposition and spin-on coating. When one of the first and second low k materials (18, 20) is composed of a cured PPLK material, a PPLK material is first formed as described herein and thereafter a curing step is performed any time after deposition of the PPLK material that converts the PPLK material into a cured and permanent low k material.

After forming the first and second low k materials (18, 20), a first patterned photoresist 22 having at least one first opening 24 is formed atop the upper surface of the second low k material 20. The first patterned photoresist 22 is composed of any conventional photoresist material including organic photoresist materials, inorganic photoresist materials, or hybrid photoresist materials. The first patterned photoresist 22 can be composed of a PPLK material that has been subjected to exposure, development and curing. In some embodiments, the first patterned photoresist 22 is formed by lithography which includes applying a photoresist material to the upper surface of the second low k material 20, exposing the photoresist material to a desired pattern of radiation, and developing the exposed resist utilizing a conventional resist developer. In one embodiment, a maskless exposure step is employed to pattern the photoresist material. In another embodiment, the exposure step includes the use of a mask having the desired pattern therein. The at least one first opening 24 that is present in the first patterned photoresist 22 exposes an upper surface portion of the second low k material 20.

Figure 2:
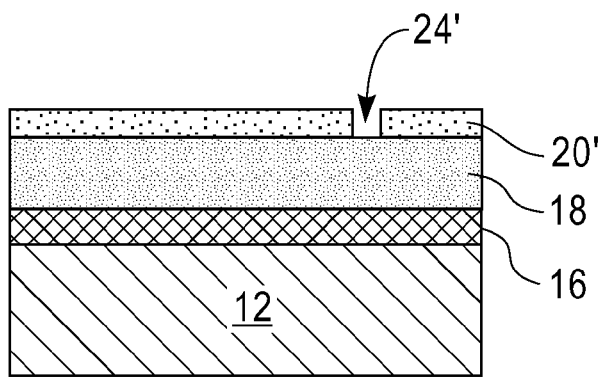
FIG. 2 is a pictorial representation (through a cross sectional view) depicting the initial structure of FIG. 1 after transferring the at least one first opening into the second low k material forming a patterned second low k material having the at least one first opening and removal of the first patterned photoresist.

Referring now to FIG. 2, there is illustrated the initial structure 10 shown in FIG. 1 after transferring the at least one first opening 24 into the second low k material 20 forming a patterned second low k material 20' having the at least one first opening 24' and subsequent removal of the first patterned photoresist 22. The transferring of the at least one first opening 24 into the second low k material 20 can be performed utilizing an etching process including dry etching or chemical wet etching. When dry etching is employed, one of reactive ion etching, ion beam etching, plasma etching, or laser ablation can be employed. When a chemical wet etching process is employed, a suitable chemical etchant that selectively removes the exposed portion of the second low k material 20 can be employed. After patterning the second low k material 20, the patterned photoresist 22 can be removed utilizing a conventional resist stripping process such as ashing.

Figure 3:
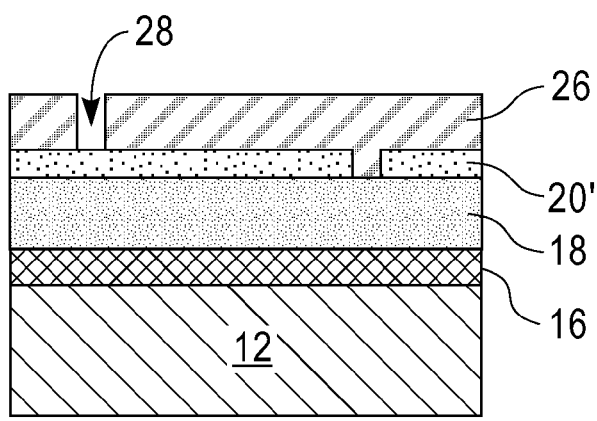
FIG. 3 is a pictorial representation (through a cross sectional view) depicting the structure of FIG. 2 after forming a second patterned photoresist including at least one second opening therein atop the patterned second low k material and within the at least one first opening in the patterned second low k material.

Referring now to FIG. 3, there is illustrated the structure of FIG. 2 after forming a second patterned photoresist 26 including at least one second opening 28 therein atop the patterned second low k material 20' as well as within the at least one first opening 24' in the patterned second low k material 20'. The second patterned photoresist 26 can include one of the photoresist materials mentioned above for the first patterned photoresist 22. Also, the second patterned photoresist 26 having the at least one second opening 28 can be formed using the lithographic process mentioned above for forming the first patterned photoresist 22.

Referring now to FIG. 4, there is illustrated the structure of FIG. 3 after transferring the at least one second opening 28 into the patterned second low k material 20' and the underlying first low k material 18 and removal of the second patterned photoresist 26. The transferring of the at least one second opening 28 into the first and second low k materials can be performed utilizing one of the etching processes mentioned above and the removal of the second patterned photoresist 26 can be achieved by utilizing a conventional resist stripping process, as also mentioned above. In FIG. 4, reference numeral 20'' denotes the patterned second low k material that includes at least one first opening 24' and an upper portion of the now transferred at least one second opening, and reference numeral 18' denotes the patterned first low k material that includes a lower portion of the now transferred at least one second opening. The upper and lower portions of the at least one second opening are collectively labeled as 28' and are hereinafter just referred to as the at least one second opening 28'. The at least one second opening 28' that is within both the first and second low k materials exposes an upper surface portion of the underlying material stack 16. Although not shown in the drawings, the exposed portion of material stack 16 through the at least one second opening 28' can be opened utilizing any standard etching process that is capable of selectively removing the exposed portions of material stack 16.

Referring now to FIG. 5, there is illustrated the structure of FIG. 4 after forming a patterned and cured photo-patternable low k (PPLK) material 30 having a plurality of electrically conductive filled regions 32 therein. The patterned and cured photo-patternable low k (PPLK) material 30 also includes gaps 36. The gaps 36 are located between neighboring electrically conductive filled regions. As shown in FIG. 5, at least one of the plurality of electrically conductive filled regions is located within the at least one second opening 28' and one of the gaps 36 is located above and connected with the at least one first opening 24' located within the patterned second low k material 20''.

The patterned and cured PPLK material 30 is a positive-tone PPLK material initially formed utilizing a deposition process including, for example, spin-on-coating, dip coating, brush coating, blade coating, chemical solution deposition, and ink-jet dispensing. After applying the PPLK material, a post deposition baking step is typically, but not necessarily always, employed to remove unwanted components, such as solvent. When performed, the baking step can be conducted at a temperature from 40° C. to 200° C., with a baking temperature from 60° C. to 140° C. being more preferred. The duration of the baking step varies from 10 seconds to 600 seconds and is not critical herein. The thickness of the applied PPLK material may vary depending on the requirement of the chip and the technique used to form the same as well as the material make-up of the applied PPLK material. Typically, the applied PPLK material has a thickness from 1 nm to 50000 nm, with a thickness from 20 nm to 5000 nm being more typical.

After applying the PPLK material, the applied PPLK material is processed to include at least one, typically, a plurality, of electrically conductive filled regions 32. The electrically conductive filled regions 32 are typically separated from the PPLK material by a diffusion barrier 34. The electrically conductive filled regions 32 are formed within the applied PPLK material by conventional lithography (including a pattern wise exposure step). An optional post-exposure baking may be required to effect the photochemical reactions. When performed, the baking step is conducted at a temperature from 60° to 200° C., with a baking temperature from 80° to 140° C. being more preferred. The duration of the baking step varies and is not critical to the practice of the present invention. After exposure and post-exposure baking, the latent images are developed with an appropriate developer, usually an aqueous base solution, such as 0.26N tetramethylammoniahydroxide (TMAH) solution, to form a relief PPLK pattern.

The pattern wise exposing process can be accomplished in a variety of ways, including, for example, through a mask with a lithography stepper or a scanner with an exposure light source of G-line, I-line (365 nm), Deep UV (248 nm, 193 nm, 157 nm, 126 nm), Extreme UV (13.4 nm), or an electron beam. The exposing process may be performed in a dry mode or an immersion mode. The pattern-wise exposing process also includes direct writing without the use of a mask with, for example, light, electron beam, ion beam, and scanning probe lithography. Other patterning techniques that can be used include contact printing techniques such as nanoimprint lithography, embroising, micro contact printing, replica molding, microtransfer molding, micromolding in capillaries and solvent-assisted micromolding, thermal assisted embroising, inject printing, and the like.

After the pattern wise exposure and development, the thus formed opening within the applied PPLK material is filled with an electrically conductive material and planarized. In some embodiments, a diffusion barrier 34, which may comprise Ta, TaN, Ti, TiN, Ru, RuTaN, RuTa, W, WN or any other material that can serve as a barrier to prevent electrically conductive material from diffusing through, is typically formed prior to filling the opening within the PPLK material with the electrically conductive material. The diffusion barrier 34 can be formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. In some embodiments (not shown), the diffusion barrier 34 may comprise a combination of layers. The thickness of the diffusion barrier 34 may vary depending on the exact means of the deposition process employed as well as the material and number of layers employed. Typically, the diffusion barrier 34 has a thickness from 4 to 40 nm, with a thickness from 7 to 20 nm being more typical.

Following the formation of the diffusion barrier 34, the remaining region of each opening formed into the developed PPLK material is filled with an electrically conductive material forming electrically conductive filled regions 32. The electrically conductive material includes, for example, polySi, an electrically conductive metal, an alloy comprising at least one electrically conductive metal, an electrically conductive metal silicide, an electrically conductive nanotube or nanowire, graphene or combinations thereof. In one embodiment, the electrically conductive material is a conductive metal such as Cu, W, Al, Mn, Co, Ta, Ti or a combination thereof, with Cu or a Cu alloy (such as AlCu) being highly preferred in some embodiments of the present invention. The electrically conductive material is filled into the opening of the developed PPLK material utilizing a conventional deposition process including, but not limited to CVD, PECVD, sputtering, chemical solution deposition or plating. In some embodiments, electrochemical plating is preferred technique used in filling the opening within the developed PPLK material with the electrically conductive material.

After forming the plurality of electrically conductive filled regions 32 and optionally the diffusion barrier 34 within openings formed into the PPLK material, the PPLK material including the plurality of electrically conductive filled regions 32, is subjected to a second exposure step and development step that forms gaps 36 in the PPLK material between neighboring electrically conductive filled regions. The second exposure step used in forming gaps 36 includes the same lithographic exposure step mentioned above in forming the openings in the as-deposited PPLK material in which the electrically conductive filled regions 32 were subsequently formed. The development step used in forming gaps 36 is also the same as described above in forming the electrically conductive filled regions 32. After forming gaps 36 into the PPLK material, a curing step is performed which converts the PPLK material into a patterned and cured PPLK material 30. It is observed that the patterned and cured PPLK material 30 remains as a permanent on-chip low-k interconnect dielectric material within the structure.

Curing is performed by a thermal cure, an electron beam cure, an ultra-violet (UV) cure, an ion beam cure, a plasma cure, a microwave cure or a combination thereof. The conditions for each of the curing processes are well known to those skilled in the art and any condition can be chosen as long as it converts the previously processed PPLK material into a patterned and cured PPLK material 30 that maintains structure fidelity and provides good electrical and mechanical properties. The cured product of processed PPLK material has a dielectric constant of 4.3 or less, with a dielectric constant of less than 3.8 being more typical.

In one embodiment, the irradiation cure step is performed by a combination of a thermal cure and an ultra-violet (UV) cure wherein the wavelength of the ultra-violet (UV) light is from 50 nm to 300 nm and the light source for the ultra-violet (UV) cure is a UV lamp, an excimer (exciplex) laser or a combination thereof. The excimer laser may be generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from 50 nm to 300 nm. Additionally, the light of the ultra-violet (UV) cure may be enhanced and/or diffused with a lens or other optical diffusing device known to those skilled in the art.

In another embodiment, the curing step is a combined UV/thermal cure. This combined UV/thermal cure is carried out in a UV/thermal cure module under vacuum or inert atmosphere, such as $N_2$, He or Ar. Typically, the UV/thermal cure temperature is from 100° C. to 500° C., with a cure temperature from 300° C. to 450° C. being more typical. The duration of the UV/thermal cure is from 0.5 min to 30 min with a duration from 1 nm to 10 min being more typical. The UV cure module is designed to have a very low oxygen content to avoid degradation of the resultant dielectric materials.

Referring now to FIG. 6, there is illustrated the structure of FIG. 5 after performing a lateral etching process that forms an expanded width gap 38 within the patterned first low k material 18'. The expanded width gap 38 is located beneath and connected to the first opening 24' within the patterned second low k material 20", which first opening 24' is in turn located beneath and connect with one of the gaps 36 formed in the patterned and cured PPLK material 30. As shown, the expanded width gap 38 has a width that is greater than the overlying and connected first opening 24' and one of gaps 36. The lateral etching process that can be employed in the present invention includes wet etching or a combination of plasma modification and wet cleaning. For example, oxygen plasma, $NH_3$ plasma, or $N_2$ plasma can be used to isotropically modify the exposed portion of the first low k material.

The modified portion of the first low k material is subsequently removed by a wet etch (e.g., diluted HF dip), while the unmodified part of the low-k is not etched away.

Referring to FIG. 7, there is illustrated the structure of FIG. 6 after forming a dielectric cap 40 atop the patterned and cured photo-patternable low k material 30 forming air gaps 42 within the structure. Dielectric cap 40 that is employed in the present disclosure includes one of the dielectric capping materials mentioned above that can be used within material stack 16. The dielectric cap 40 can be formed as described above and its thickness is within the range of thickness given for dielectric cap that can be employed within material stack 16.

It is observed that the processing steps mentioned above in connection with FIGS. 1-7 provide an air gap-containing interconnect structure such as shown, for example, in FIG. 7, that includes a substrate 12, a material stack 16 located on an upper surface of the substrate 12, a patterned first low k material 18' located on an uppermost surface of the material stack 16, a patterned second low k material 20" located on an upper surface of the patterned first low k material 18', a patterned and cured photo-patternable low k (PPLK) material 30 located on an upper surface of the patterned second low k material 20", and a dielectric cap 40 located on an upper surface of the patterned and cured PPLK material 30, wherein said patterned and cured PPLK material 30 has a plurality of electrically conductive filled regions 32 and air gaps 42 located therein in which at least a lower portion of one of the plurality of electrically conductive filled regions (see, the electrically conductive filled region 32 on the far left hand side of FIG. 7) extends through the patterned first and second low k materials (18' and 20"), and where one of the air gaps (see the air gap 36 on the far right hand side of FIG. 7) includes an extended width lower portion (see element 38) that is present in the first patterned low k material 18' and is connected with said one of the air gaps in the patterned and cured PPLK 30 by an opening (24') within the patterned second low k material 20".

Reference is now made to FIGS. 8-14 which illustrate a second embodiment of the present disclosure. The second embodiment begins by providing the initial structure 100 shown in FIG. 8. Specifically, the initial structure 100 shown in FIG. 8 includes from bottom to top, a substrate 12, a material stack 16, a first low k material 18, a second low k material 20 and a self-assembled co-polymer mask 102 including a plurality of openings 104 therein. The substrate 10, the material stack 16, the first low k material 18 and the second low k material 20 are the same as those described above in connection with the initial structure 10 shown in FIG. 1. As such, the above description for substrate 10, the material stack 16, the first low k material 18 and the second low k material 20 is applicable here for this embodiment and is thus incorporated herein by reference.

As stated above, the initial structure 100 also includes a self-assembled co-polymer mask 102 including a plurality of openings 104 therein which is located atop the second low k material 20.

The self-assembled co-polymer mask 102 having the plurality of openings 104 is made from a self-assembling block copolymer system that is capable of self-organizing into nanometer-scale patterns. The self-assembling block copolymer system typically contains two or more different polymeric block components that are immiscible with one another. Under suitable conditions, the two or more immiscible polymeric block components separate into two or more different phases on a nanometer scale and thereby form ordered patterns of isolated nano-sized structural units. Such ordered patterns of isolated nano-sized structural units formed by the self-assembling block copolymers can be used for fabricating nano-scale structural units in semiconductor devices. Specifically, dimensions of the structural units so formed are typically in the range of 10 to 40 nm, which are sub-lithographic (i.e., below the resolutions of the lithographic tools). Further, the self-assembling block copolymers are compatible with conventional semiconductor processes.

In this embodiment of the invention, a thin layer of a self-assembling block copolymer (having a thickness typically ranging from 20 nm to 100 nm) is first applied over the second low k material 20 and then annealed to form an ordered pattern containing repeating structural units. Many different types of block copolymers can be used for practicing this embodiment of the instant disclosure. As long as a block copolymer contains two or more different polymeric block components that are immiscible with one another, such two or more different polymeric block components are capable of separating into two or more different phases on a nanometer scale and thereby form patterns of isolated nano-sized structural units under suitable conditions. In one embodiment, the block copolymer consists essentially of first and second polymeric block components A and B that are immiscible with each other. The block copolymer may contain any numbers of the polymeric block components A and B arranged in any manner. The block copolymer can have either a linear or a branched structure. In one embodiment, the block copolymer is a linear diblock copolymer having the formula of A-B.

Specific examples of suitable block copolymers that can be used may include, but are not limited to, polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The specific structural units formed by the block copolymer are determined by the molecular weight ratio between the first and second polymeric block components A and B. For example, when the ratio of the molecular weight of the first polymeric block component A over the molecular weight of the second polymeric block component B is greater than about 80:20, the block copolymer will form an ordered array of spheres composed of the second polymeric block component B in a matrix composed of the first polymeric block component A. When the ratio of the molecular weight of the first polymeric block component A over the molecular weight of the second polymeric block component B is less than 80:20 but greater than 60:40, the block copolymer will form an ordered array of cylinders composed of the second polymeric block component B in a matrix composed of the first polymeric block component A. When the ratio of the molecular weight of the first polymeric block component A over the molecular weight of the second polymeric block component B is less than 60:40 but is greater than 40:60, the block copolymer will form alternating lamellae composed of the first and second polymeric block components A and B. Therefore, the molecular weight ratio between the first and second polymeric block components A and B can be readily adjusted in the block copolymer of the present invention, in order to form desired structural units.

In one embodiment, the ratio of the molecular weight of the first polymeric block component A over the molecular weight of the second polymeric block component B ranges from 60:40 to 40:60, so that the block copolymer of the present invention will form alternating layers of the first polymeric block component A and the second polymeric block component B.

In this embodiment, one of the components A and B can be selectively removable relative to the other, thereby resulting in orderly arranged structural units composed of an un-removed component, i.e., the self-assembled co-polymer mask 102. For example, when the second polymeric block component B is selectively removable relative to the first polymeric block component A, orderly arranged trenches can be formed. In one embodiment, the block copolymer used for forming the self-assembled periodic patterns is PS-b-PMMA with a PS:PMMA molecular weight ratio ranging from 60:40 to 40:60.

Typically, mutual repulsion between different polymeric block components in a block copolymer is characterized by the term $\chi N$, where $\chi$ is the Flory-Huggins interaction parameter and N is the degree of polymerization. The higher $\chi N$, the higher the repulsion between the different blocks in the block copolymer, and the more likely the phase separation therebetween. When $\chi N > 10$ (which is hereinafter referred to as the strong segregation limit), there is a strong tendency for the phase separation to occur between different blocks in the block copolymer.

For a PS-b-PMMA diblock copolymer, $\chi$ can be calculated as approximately $0.028+3.9/T$, where T is the absolute temperature. Therefore, $\chi$ is approximately 0.0362 at 473K ($\approx 200°$ C.). When the molecular weight ($M_n$) of the PS-b-PMMA diblock copolymer is approximately 64 Kg/mol, with a molecular weight ratio (PS:PMMA) of approximately 66:34, the degree of polymerization N is about 622.9, so $\chi N$ is approximately 22.5 at 200° C.

In this manner, by adjusting one or more parameters such as the composition, the total molecular weight, and the annealing temperature, the mutual compulsion between the different polymeric block components in the block copolymer can be readily controlled to effectuate desired phase separation between the different block components. The phase separation in turn leads to formation of self-assembled periodic patterns containing ordered arrays of repeating structural units (i.e., spheres, cylinders, or lamellae.

In order to form the self-assembled periodic patterns, the block copolymer is first dissolved in a suitable solvent system to form a block copolymer solution, which is then applied onto a surface of the second low k material 20 to form a thin block copolymer layer, followed by annealing of the thin block copolymer layer, thereby effectuating phase separation between different polymeric block components contained in the block copolymer.

The solvent system used for dissolving the block copolymer and forming the block copolymer solution may comprise any suitable solvent, including, but not limited to, toluene, propylene glycol monomethyl ether acetate (PGMEA), propylene glycol monomethyl ether (PGME), and acetone. The block copolymer solution preferably contains the block copolymer at a concentration ranging from 0.1% to 2% by total weight of the solution. More preferably, the block copolymer solution contains the block copolymer at a concentration ranging from 0.5 wt % to 1.5 wt %. In one embodiment, the block copolymer solution comprises 0.5 wt % to 1.5 wt % PS-b-PMMA dissolved in toluene or PGMEA.

The block copolymer solution can be applied by any suitable technique, including, but not limited to, spin casting, coating, spraying, ink coating, dip coating, etc. Preferably, the block copolymer solution is spin cast onto the surface of the second low k material 20 to form a thin block copolymer layer thereon.

After application of the thin block copolymer layer onto the surface of the second low k material 20, the entire structure is annealed to effectuate micro-phase segregation of the different block components contained by the block copolymer, thereby forming the periodic patterns with repeating structural units. Annealing of the block copolymer can be achieved by various methods known in the art, including, but not limited to, thermal annealing (either in a vacuum or in an inert atmosphere containing nitrogen or argon), ultra-violet annealing, laser annealing, solvent vapor-assisted annealing (either at or above room temperature), and supercritical fluid-assisted annealing, which are not described in detail here in order to avoid obscuring the invention.

In one embodiment, a thermal annealing step is carried out to anneal the block copolymer layer at an elevated annealing temperature that is above the glass transition temperature ($T_g$) of the block copolymer, but below the decomposition or degradation temperature ($T_d$) of the block copolymer. More preferably, the thermal annealing step is carried out an annealing temperature between 200° C.-300° C. The thermal annealing may last from less than 1 hour to 100 hours, and more typically from 1 hour to 15 hours. In an alternative embodiment of the present invention, the block copolymer layer is annealed by ultra-violet (UV) treatment.

After annealing, one of the polymeric components of the self-assembled block copolymer can be selectively removable relative to the other, thereby resulting the formation of the self-assembled co-polymer mask 102. The removal of one of the components is achieve utilizing any suitable solvent that selectively removes one of the polymeric components of the self-assembled block copolymer relative to the other component. The remaining component of the self-assembled block copolymer is used as mask 102 in the present disclosure. As such, mask 102 has regularly repeating structure units having a sub-lithographic width as mentioned above. The openings 104 within the mask 102 also have a sub-lithographic width since they are formed by selectively removing one of the phase separated polymeric components from the annealed block copolymer.

Referring to FIG. 9, there is shown the structure of FIG. 8 after etching the exposed portions of the second low k material 20 utilizing the self-assembled co-polymer mask 102 as an etch mask and subsequent removal of mask 102. In FIG. 9, reference numeral 20' denotes the patterned second low k material that now includes sub-lithographic openings 106 located therein. The etching of the exposed portions of the second dielectric low k material 20 is performed utilizing one of dry etching and chemical wet etching. When dry etching is employed, one of reactive ion etching, plasma etching, ion beam etching or laser ablation can be employed. When a chemical etch process is employed, a suitable chemical etchant can be used. After etching, the mask 102 is removed utilizing a conventional stripping process such as, for example, plasma etching, reactive ion etching or wet chemical etching.

Referring to FIG. 10, there is shown the structure of FIG. 9 after forming a patterned photoresist 108 having at least one opening 110 therein that exposes at least one of the sub-lithographic openings 106 within the previously patterned second low k material 20'. The patterned photoresist 108 includes one of resist materials mentioned above for the first patterned photoresist 22 and the patterned photoresist 108 is processed using one of the lithographic techniques mentioned above as well.

Referring now to FIG. 11, there is illustrated the structure of FIG. 10 after etching exposed portions of the first low k material 18 utilizing the patterned photoresist 108 as an etch mask and removal of the patterned photoresist 108. The etching of the exposed portions of the first low k material 18 forms a patterned first low k material 18' having at least one sub-lithographic sub-lithographic opening 110 located therein which extends to an upper surface of material stack 16. The etching of the exposed portions of the second low k material 18 includes one of dry etching and wet chemical etching. The patterned photoresist 108 is removed utilizing a conventional resist stripping process such as, for example, ashing. Although not shown in the drawings, the exposed portions of the material stack 16 through sub-lithographic opening 110 can be opened utilizing any conventional etching technique well known to those skilled in the art.

Referring to FIG. 12, there is depicted the structure of FIG. 11 after forming a patterned and cured photo-patternable low k material 30 having a plurality of electrically conductive filled regions 32 and gaps 36 located therein, wherein at least one of the plurality of electrically conductive filled regions 32 is located within sub-lithographic opening 110. An optional diffusion barrier 34 can be located between each of the regions 32 and the PPLK material 30. This step of this embodiment of the present disclosure includes the materials and processing steps mentioned above in forming the structure shown in FIG. 5 of the first embodiment. As such, the various like materials and processing steps mentioned above in forming the patterned and cured PPLK material 30 having gaps 36 and a plurality of electrically conductive filled regions 32 are also applicable here and are thus incorporated herein by reference.

Referring to FIG. 13, there is depicted the structure of FIG. 12 after performing a lateral etch that forms an expanded width gap 38 in the patterned first low k material 18'. The expanded width gap 38 is formed utilizing the lateral etching process mentioned above in the first embodiment of the invention. As shown, the expanded width gap 38 connects at least two of the gaps 36 that are present in the overlying patterned and cured PPLK material 30.

Referring to FIG. 14, there is depicted the structure of FIG. 13 after forming a dielectric cap 40 atop the PPLK material 30 forming air gaps 42 within the structure. The dielectric cap 40 is the same as that described above in the first embodiment of the present invention. As such, the various materials and processing techniques mentioned above in forming dielectric cap 40 in the first embodiment are incorporated herein for this embodiment of the instant disclosure.

It is observed that the processing steps mentioned above in connection with FIGS. 8-14 provide an air gap-containing interconnect structure such as shown, for example, in FIG. 14, that includes a substrate 12, a material stack 16 located on an upper surface of the substrate 12, a patterned first low k material 18' located on an uppermost surface of the material stack 16, a patterned second low k material 20' located on an upper surface of the patterned first low k material 18', a patterned and cured photo-patternable low k (PPLK) material 30 located on an upper surface of the patterned second low k material 20', and a dielectric cap 40 located on an upper surface of the patterned and cured PPLK material 30, wherein said patterned and cured PPLK material 30 has a plurality of electrically conductive filled regions 32 and air gaps 42 located therein in which at least a lower portion of one of the plurality of electrically conductive filled regions (see, the electrically conductive filled region 32 on the far left hand side of FIG. 14) extends through the patterned first and second low k materials (18' and 20'), and where one of the air gaps (see the air gap 36 on the far right hand side of FIG. 14) includes an extended width lower portion (see element 38) that is present in the first patterned low k material 18' and is connected with said one of the air gaps in the patterned and cured PPLK 30 by an opening (24') within the patterned second low k material 20'.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming an air gap-containing interconnect structure comprising:

providing a patterned mask on a surface of an initial structure, said initial structure including a substrate, a material stack located on an upper surface of the substrate, a first low k material located on an uppermost surface of the material stack, and a second low k material located on an upper surface of said first low k material, wherein said patterned mask has at least one first opening that exposes a portion of said second low k material;

etching the exposed portion of the second low k material utilizing the patterned mask as an etch mask to form a patterned second low k material, said patterned second low k material includes an extended portion of said at least one first opening;

forming a patterned photoresist on an upper surface of said patterned second low k material, wherein a portion of said patterned photoresist fills the extended portion of the at least one first opening within the patterned second low k material, said patterned photoresist having at least one second opening that exposes a portion of said patterned second low k material;

etching the exposed portion of the patterned second low k material as well as underlying portions of the first low k material utilizing the patterned photoresist as an etch mask to form a twice patterned second low k material having said extended portion of the at least one first opening and an upper portion of said at least one second opening therein and a patterned first low k material having a lower portion of said at least one second opening therein;

forming a patterned and cured photo-patternable low k material having a plurality of electrically conductive filled regions and gaps located therein atop the twice patterned second low k material, wherein at least one of the plurality of electrically conductive filled regions is located within the at least one second opening and wherein one of the gaps is located above and connected with the extended portion of the at least one first opening located within the twice patterned second low k material;

performing a lateral etching process that forms an expanded width gap within the patterned first low k material which is located beneath and connected with the extended portion of the at least one first opening formed in the twice patterned second low k dielectric material; and forming a dielectric cap atop the patterned and cured photo-patternable low k material forming air gaps at least within the patterned and cured photo-patternable low k material.

2. The method of claim 1 wherein the patterned mask is a patterned photoresist formed by lithography.

3. The method of claim 1 wherein the patterned mask is self-assembled co-polymer mask formed utilizing a self-assembling block copolymer, annealing the self-assembling block copolymer into a self-assembled block copolymer and removing at least one of polymeric components of the self-assembled block copolymer.

4. The method of claim 3 wherein said self-assembled co-polymer mask has sub-lithographic features.

5. The method of claim 1 wherein said material stack includes a dielectric cap, an antireflective coating or both a dielectric cap and an antireflective coating.

6. The method of claim 1 wherein said material stack is a patterned material stack, and a lower portion of one of the plurality of electrically conductive filled regions extends through said patterned material stack.

7. The method of claim 1 wherein said patterned and cured photo-patternable low k material includes applying a positive-tone photo-patternable low k composition, first exposing the applied positive-tone photo-patternable low k composition to radiation, developing the exposed portions of the applied positive-tone photo-patternable low k composition, filling the developed regions with at least an electrically conductive material, second exposing and developing to form said gaps, and curing.

8. The method of claim 7 wherein said curing includes a thermal cure, an electron beam cure, an UV cure, an ion beam cure, a plasma cure, a microwave cure or any combinations thereof.

9. The method of claim 1 wherein said lateral etching process includes wet etching or a combination of plasma modification and wet cleaning.

10. The method of claim 9 wherein said plasma modification includes using an oxygen plasma, a $NH_3$ plasma, or $N_2$ plasma which isotropically modifies an exposed portion of the patterned first low k material, and wherein the modified portion is subsequently removed by a diluted HF dip.

11. The method of claim 1 wherein the plurality of electrically conductive filled regions as well as the air gaps within the patterned and cured photo-patternable low k material have a sub-lithographic width.

12. The method of claim 1 wherein said patterned and cured photo-patternable low k material is formed from a positive-tone photo-patternable low-k material.

13. The method of claim 1 wherein said plurality of electronically conductive filled regions includes Al, Cu, W, Mn, Co, Ta, Ti or a combination thereof.

14. The method of claim 1 wherein said first low k material and said second low k material are composed of different low k materials having different etch rates.

15. The method of claim 1 wherein at least one of the substrate, the first low k material and the second low k material is comprised of an antireflective coating.

16. The method of claim 1 wherein some of the air gaps stop on the upper surface of the twice patterned second low k material.

17. The method of claim 1 wherein the extended width lower portion is located beneath at least two of the plurality of electrically conductive filled regions within the patterned and cured photo-patternable low k material.

18. The method of claim 1 wherein said forming the patterned and cured comprising depositing photo-patternable composition including a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetraalkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

* * * * *